(12) United States Patent
Noguchi

(10) Patent No.: US 6,500,693 B2
(45) Date of Patent: Dec. 31, 2002

(54) ELECTRODE FORMING METHOD AND BUMP ELECTRODE FORMABLE BASE USED THEREFOR

(75) Inventor: Yoshie Noguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/832,868

(22) Filed: Apr. 12, 2001

(65) Prior Publication Data

US 2002/0055255 A1 May 9, 2002

(30) Foreign Application Priority Data

Nov. 8, 2000 (JP) .......................................... 2000-340135

(51) Int. Cl.[7] .......................... H01L 21/44; H01L 21/48; H01L 21/50
(52) U.S. Cl. ....................................................... 438/106
(58) Field of Search .......................................... 438/106

(56) References Cited

U.S. PATENT DOCUMENTS

| 4,828,886 A | 5/1989 | Hieber | |
| 5,193,738 A | 3/1993 | Hayes | |
| 5,597,110 A * | 1/1997 | Melton et al. | 228/203 |
| 5,633,204 A * | 5/1997 | Tago et al. | 438/614 |
| 6,313,651 B1 * | 11/2001 | Hembree et al. | 324/755 |
| 6,335,271 B1 * | 1/2002 | Fukuyama | 438/616 |

FOREIGN PATENT DOCUMENTS

| JP | 62-257750 | 11/1987 |
| JP | 8-29408 | 3/1996 |

* cited by examiner

Primary Examiner—Richard Elms
Assistant Examiner—Michael K. Luhrs
(74) Attorney, Agent, or Firm—Leydig, Voit & Mayer, Ltd.

(57) ABSTRACT

A semiconductor device is mounted on a heating stage, and the temperature of the semiconductor device is set to be at least 60° C. and lower than the melting point of a solder. With the use of an ejecting head, molten solder is ejected from a nozzle towards an electrode part. The molten solder ejected from the ejecting head impinges upon the surface of the electrode part. Upon impingement, the molten solder spreads over the surface of the electrode part by wetting, thereby to form a bump electrode on the electrod part. Sufficient joining strength between the bump electrode and the underlying conductive region is ensured.

13 Claims, 9 Drawing Sheets

ELECTRODE FORMING METHOD AND BUMP ELECTRODE FORMABLE BASE USED THEREFOR

BACKGROUND OF THE INVENTION

1. Field of the Invention

The present invention relates to an electrode forming method a bump electrode formable base used therefor, and more particularly to an electrode forming method for forming a bump electrode and a bump electrode formable base used in the production method.

2. Description of the Background Art

In accordance with rapid development of internet networks and spread of portable information devices to markets, higher speed and higher functions as well as scale reduction and weight reduction are sought for in semiconductor packages. In order to meet these demands, the modes of semiconductor packages are changing rapidly from peripheral terminal type packages, such QFP (Quad Flatpack Package) to area array type packages, such as BGA (Ball Grid array) and CSP (Chip Scale Package).

In accordance with such change in the modes of semiconductor packages, what is attracting people's attention for establishing connection between a semiconductor device and a circuit substrate is a flip-chip connection which can connect pins at a high density (multi-pin connection) and which is excellent in electrical characteristics as well.

The flip-chip connection is a method in which electrodes (bump electrodes) made of a low-melting-point metal alloy are formed on a semiconductor package, and the bump electrodes are brought into contact with a predetermined place of a substrate or the like to establish an electrical and mechanical connection between the semiconductor package and the substrate by heat fusion. In order to provide such a flip-chip connection, various methods of forming a bump electrode have been developed.

As a method for forming such a bump electrode, the solder paste printing method and the plating method may be mentioned. By adopting these methods, a solder material can be collectively supplied onto pad electrodes, thereby giving a high productivity. However, these methods require cleaning and removal of flux components for activating the solder surface, which are used in a thermal treatment step for melting the supplied solder material.

As a means for solving such problems of the solder printing method and others, Japanese Patent Laying-Open No. 62-257750/1987 proposes a method of forming pad electrodes with the use of a dispenser nozzle. This method is a method in which a molten solder is jetted from the dispenser nozzle for fixation onto the pad electrode.

An underlayer metal of chromium, copper, and gold is laminated on the surface of the pad electrode in order to ensure wettability. Further, the pad electrode is heated to at least 100° C. A suitable amount of solder grains are jetted from the tip of the dispenser nozzle towards the pad electrode by introducing a gas such as nitrogen into the dispenser nozzle and applying a pulse-like pressure to the molten solder by operating a gas on-off valve. By this process, a bump electrode is formed on the pad electrode.

However, according to the aforesaid method of using a dispenser nozzle, a sufficient joining strength between the bump electrode and the pad electrode may not be obtained depending on the surface condition or the temperature of the pad electrode. As a result, it may not be possible to obtain good electrical connection between the semiconductor package and the substrate.

SUMMARY OF THE INVENTION

The present invention has been made in order to solve the aforementioned problems of the prior art. One object of the present invention is to provide an electrode forming method capable of ensuring a joining strength between the bump electrode and the pad electrode. The other object of the present invention is to provide a bump electrode formable base used for such an electrode forming method.

The first one of the electrode forming method according to one aspect of the present invention is a method for forming a bump electrode on an underlying conductive region, and includes an electrode forming step for ejecting a molten solder for adhesion onto the underlying conductive region that has been set at a temperature of at least 60° C. and lower than a melting point of the solder.

It has been found out that, according to this electrode forming method, by setting the temperature of the underlying conductive region to be at least 60° C. and lower than the melting point of the solder, an alloy layer is formed between the solder and the underlying conductive region to provide a sufficient joining strength between the bump electrode and the underlying conductive region. It has also been found out that, if the temperature of the underlying conductive region is lower than 60° C., this alloy layer is not formed. On the other hand, it has been found out that, if the temperature of the underlying conductive region is higher than or equal to the melting point of the solder, wrinkles are formed on the surface of the adhering solder, thereby producing a bump with a distorted shape.

In view of enhancing the cleanness of the surface of the underlying conductive region, the electrode forming step preferably includes a step of performing plasma-cleaning on the surface of the underlying conductive region by exposing the underlying conductive region to a plasma atmosphere in advance.

In this case, the wettability of the underlying conductive region is enhanced and, even if the temperature of the underlying conductive region is comparatively low, a sufficient alloy layer is formed between the solder and the underlying conductive region, so that the joining strength between the two is further improved.

Furthermore, if the cleanness of the surface of the underlying conductive region is not so high and the wettability is comparatively low, the electrode forming step preferably includes a step of setting the temperature of the underlying conductive region to be at least 150° C.

In this case, even if the wettability of the underlying conductive region is low, a sufficient alloy layer is formed between the solder and the underlying conductive region, so that the joining strength between the two can be enhanced.

Further, the electrode forming step preferably includes a step of performing rapid cooling and solidification on the underlying conductive region and the solder after adhesion of the molten solder onto the underlying conductive region.

In this case, by rapid cooling and solidification, crystal grains of the molten solder and the alloy layer formed between the solder and the underlying conductive region become dense, so that the joining strength between the two can be further enhanced.

Further, the electrode forming step preferably includes a step of applying supersonic wave to the underlying conductive region in allowing the molten solder to adhere onto the underlying conductive region.

In this case, the oxide coat present on the surface of the molten solder is easily broken by the supersonic wave when the molten solder impinges upon the underlying conductive region. Therefore, the surface of the underlying conductive region is wetted by the solder, and the solder spreads easily over the entire surface to form an alloy layer sufficiently between the solder and the underlying conductive region. As a result, the joining strength between the bump electrode and the underlying conductive region can be further enhanced.

The second one of the electrode forming method according to one aspect of the present invention is an electrode forming method for forming a bump electrode on an underlying conductive region, and includes a step of forming a projection on a surface of the underlying conductive region and ejecting a molten solder towards the projection for adhesion.

According to this electrode forming method, the oxide coat present on the surface of the molten solder is easily broken by the projection when the molten solder impinges upon the underlying conductive region. Therefore, the surface of the underlying conductive region is wetted by the solder, and the solder spreads easily over the entire surface to form an alloy layer sufficiently between the solder and the underlying conductive region. As a result, the joining strength between the bump electrode and the underlying conductive region can be improved.

In view of enhancing the cleanness of the surface of the underlying conductive region, the electrode forming step preferably includes a step of performing plasma-cleaning on the surface of the underlying conductive region by exposing the underlying conductive region to a plasma atmosphere after forming the projection and before ejecting the molten solder.

In this case, the wettability of the underlying conductive region is enhanced, and the joining strength between the bump electrode and the underlying conductive region is further improved.

Further, the electrode forming step preferably includes a step of applying supersonic wave to the underlying conductive region in ejecting the molten solder towards the underlying conductive region.

In this case, the oxide coat present on the surface of the molten solder is easily broken by the supersonic wave when the molten solder impinges upon the underlying conductive region. Therefore, the surface of the underlying conductive region is wetted by the solder, and the solder spreads easily over the entire surface to form an alloy layer sufficiently between the solder and the underlying conductive region. As a result, the joining strength between the bump electrode and the underlying conductive region can be further enhanced.

A bump electrode formable base according to the other aspect of the present invention is a bump electrode formable base in which a bump electrode is to be formed on an underlying conductive region by ejecting a molten solder towards the underlying conductive region, wherein the bump electrode formable base includes a projection formed in the underlying conductive region for breaking an oxide coat present on a surface of the molten solder when the molten solder impinges upon the underlying conductive region.

According to this bump electrode formable base, the oxide coat present on the surface of the molten solder is easily broken by the projection when the molten solder impinges upon the underlying conductive region. Therefore, the surface of the underlying conductive region is wetted by the solder, and the solder spreads easily over the entire surface of the underlying conductive region. This allows an alloy layer to be sufficiently formed between the solder and the underlying conductive region. As a result, the joining strength between the bump electrode and the underlying conductive region is improved.

Specifically, it is preferable that the underlying conductive region is formed on a semiconductor chip or is formed on a substrate.

This enhances the joining strength between the semiconductor chip and the bump electrode or the joining strength between the substrate and the bump electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
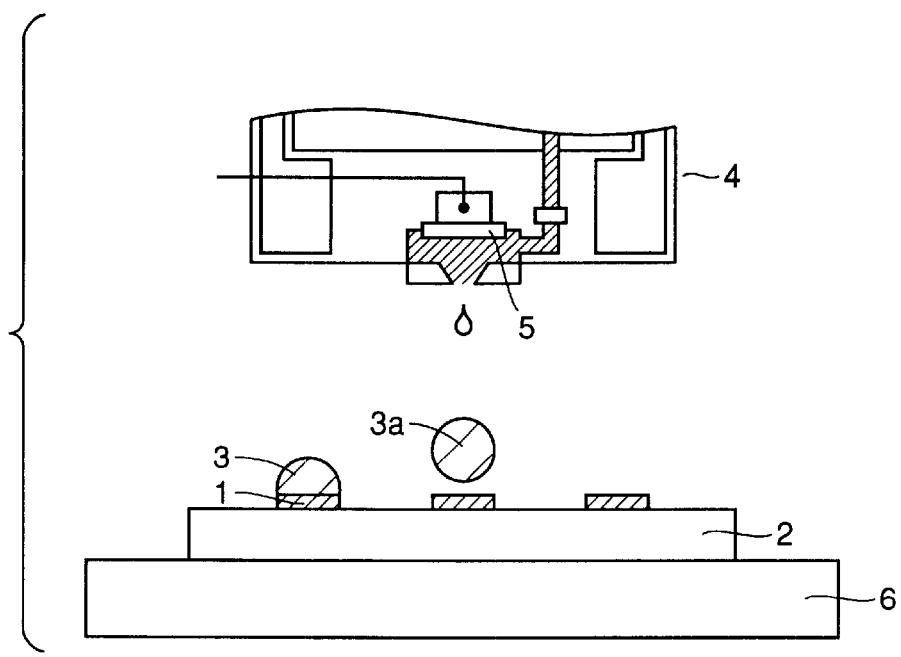
FIG. 1 is a cross-sectional view illustrating one step in the electrode forming method according to a first embodiment of the present invention.

An electrode forming method according to the first embodiment of the present invention will be described. Referring to FIG. 1, an electrode part 1 is formed in a predetermined region of a semiconductor device 2 as an underlayer for forming a bump electrode. Here, a layer of gold (Au) is formed on the uppermost surface of the electrode part 1 for prevention of corrosion. The semiconductor device 2 having the electrode part 1 formed therein is mounted on a heating stage 6. As described later, the heating stage 6 is set within a predetermined temperature range.

Next, with the use of an ejecting head 4, a molten solder 3a is ejected from a nozzle towards the electrode 1. At the ejecting head 4, the molten solder 3a can be ejected by applying a pressure to the molten solder contained in the ejecting head 4 by means of a piezoelectric element 5. The molten solder 3a ejected from the ejecting head 4 impinges upon the surface of the electrode part 1. By impingement, the molten solder 3a spreads over the surface of the electrode part 1 by wetting, thereby to form a bump electrode 3 on the electrode part 1. Thus, the bump electrode 3 is formed by scanning a plurality of electrode parts 1, which are disposed in the semiconductor device 2, with the use of ejecting head 4 to successively eject the molten solder 3a.

Here, the molten solder is ejected by scanning with the ejecting head 4; however, instead of scanning with the ejecting head 4, the molten solder may be ejected while scanning with the use of the heating stage 6.

It has been found out that, according to the aforesaid production method, in particular, by setting the heating stage 6 within a predetermined temperature range, it is possible to obtain a good joining strength between the bump electrode 3 and the underlying electrode part 1. This will be described. First, the dependency of the joining strength between the bump electrode 3 and its underlying electrode part 1 on the temperature of the heating stage 6 (the temperature of the semiconductor device 2) was evaluated.

At that time, evaluation was carried out for each of the case in which the cleanness of the surface of the electrode part 1 was high, i.e. the case in which the wettability of the surface of the electrode part 1 was comparatively high and the case in which the cleanness was not so high. The joining strength was determined by measuring a shear strength by applying a force to the formed bump electrode in a lateral direction (direction parallel to the surface of the semiconductor substrate). The result is shown in FIG. 2.

Figure 2:
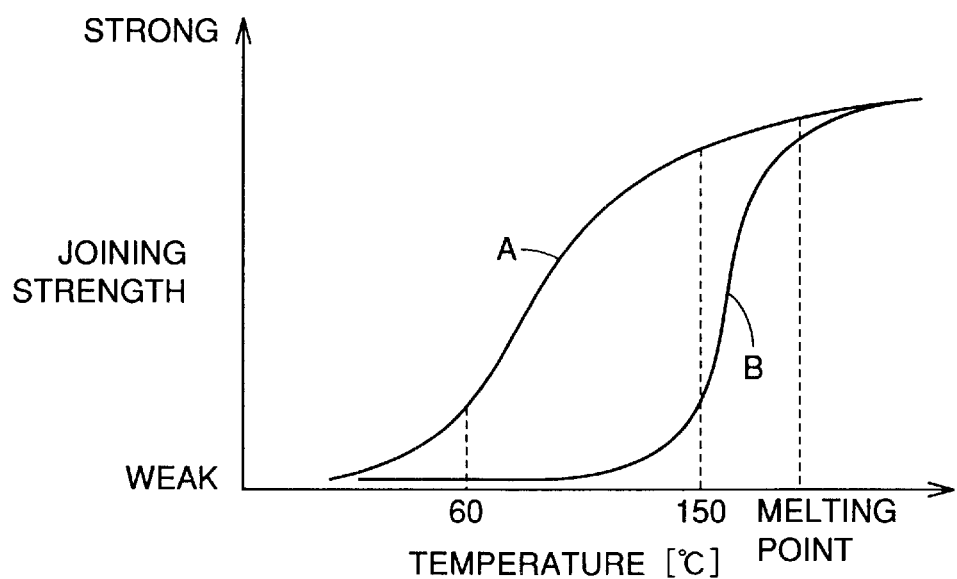
FIG. 2 is a graph showing dependency of the joining strength on the stage temperature and the wettability of the underlayer surface in the first embodiment.

Referring to FIG. 2, it has been found out that, even with the same temperature range of the heating stage 6, the joining strength differs between the case in which the wettability of the surface of the electrode part 1 is comparatively high and the case in which the wettability is low.

It has been found out that, in the case where the surface of the electrode part 1 has been subjected to a cleaning treatment in advance by exposing the electrode part 1 to a plasma atmosphere with an argon gas having a pressure of for example several ten Pa, the wettability of the surface of the electrode part 1 is improved, and the joining strength between the bump electrode 3 and the electrode part 1 is improved by setting the temperature of the stage 6 to be at least 60° C. It has been confirmed that, at this temperature, the gold on the surface of the electrode part begins to diffuse into the solder, and an intermetallic compound of the electrode part and the solder begins to be formed.

On the other hand, it has been found out that, if such a plasma treatment is not carried out and the wettability of the surface of the electrode part 1 is inferior, it is not possible to obtain a sufficient joining strength if the temperature of the stage part is within a range from 60° C. to 150° C., and the joining strength is improved if the temperature of the stage part is at least 150° C.

Further, when the temperature of the stage part is set to be higher than or equal to the melting point of the solder, wrinkles assumed to be an influence of oxidation are generated on the surface of the formed bump electrode to provide a distorted shape of the bump electrode. Therefore, it has been found out that the temperature of the stage part must be set to be lower than the melting point of the solder.

According to this evaluation result, in the case where the wettability of the surface of the electrode part 1 is comparatively high, the joining strength between the bump electrode 3 and the electrode part 1 can be improved by setting the temperature of the stage 6 to be at least 60° C. and lower than the melting point of the solder.

On the other hand, in the case where the wettability of the surface of the electrode part 1 is inferior, the joining strength between the bump electrode 3 and the electrode part 1 can be improved by setting the temperature of the stage 6 to be at least 150° C. and lower than the melting point of the solder. The melting point of the solder is about 183° C. in the case of SnPb eutectic solder, and is from 215 to 220° C. in the case of SnAgCu-series solder.

In addition to this, according to the aforesaid forming method, with the use of the ejecting head 4, a constant pressure is applied to the molten solder by the piezoelectric element 5, and the molten solder 3a of approximately the same volume can be ejected, thereby providing an almost uniform shape of the bump electrode.

Further, since such a constant pressure can be applied to the molten solder in an extremely short period of time, the throughput in the step of forming a bump electrode can be improved.

Second Embodiment

An electrode forming method according to the second embodiment of the present invention will be described. The step of forming a bump electrode is the same as the step shown in FIG. 1 and described in the first embodiment. In the method according to the second embodiment, the semiconductor device 2 is cooled after the bump electrode 3 is formed.

Namely, after the bump electrode 3 is formed, the semiconductor device 2 is quickly removed from the heating stage 6, and an inert gas such as nitrogen is sprayed onto the rear surface of the semiconductor device. Here, the temperature of the inert gas may be about room temperature.

By spraying the inert gas, the molten alloy layer of solder and gold is rapidly cooled to form dense crystal grains, whereby the joining strength is further improved. Particularly, when one takes the surface state of the electrode part into account in order to obtain a rapid cooling effect, the temperature of the stage part is preferably at least 150° C. By this production method, the joining strength between the bump electrode 3 and the electrode part 1 can be further enhanced even in the case where the wettability of the electrode part 1 is not so good.

Third Embodiment

Figure 3:
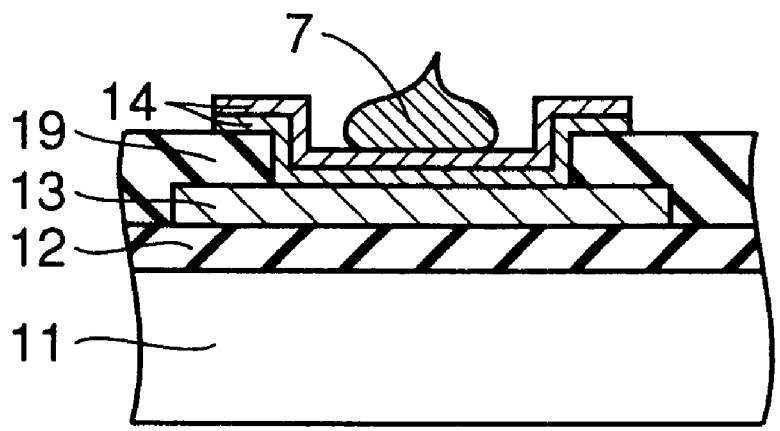
FIG. 3 is a cross-sectional view illustrating one step in the electrode forming method according to a third embodiment of the present invention.

An electrode forming method according to the third embodiment of the present invention will be described. Referring to FIG. 3, first an aluminum electrode pad 13 is formed on a silicon substrate 11 through the intermediary of a silicon oxide film 12. A silicon oxide film 19 is further formed to cover the aluminum electrode pad 13. An opening part is formed in the silicon oxide film 19 to expose the surface of the aluminum electrode pad 13. In the opening part, an underlying film 14 containing copper or the like is formed which is electrically connected to the aluminum electrode pad 13 and which includes a gold layer located at the uppermost surface thereof. The process up to this step is the same as a general process.

Next, a solder line made of SnPb eutectic solder or high melting point solder, for example, is bonded onto the surface of the underlying film 14 by the wire bonding method, thereby to form a projection 7.

Figure 4:
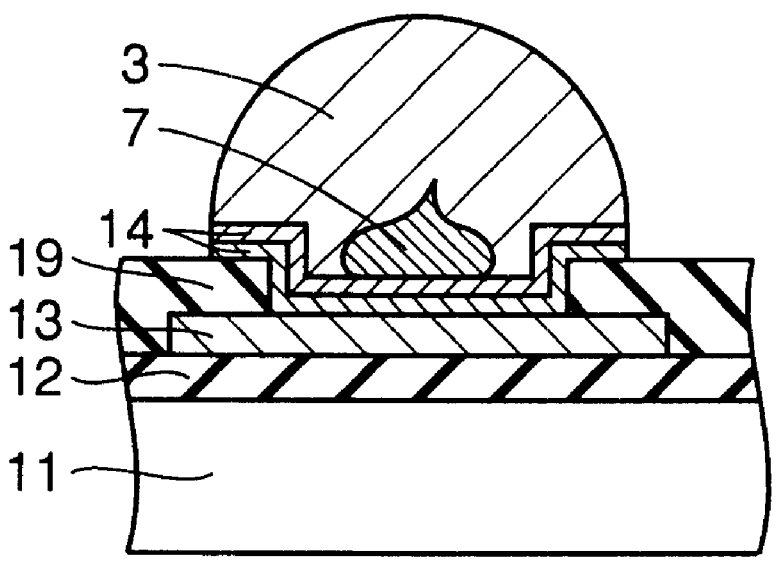
FIG. 4 is a cross-sectional view illustrating a step carried out after the step shown in FIG. 3 in the third embodiment.

Next, referring to FIG. 4, the molten solder is ejected from the ejecting head towards the projection 7 in the same manner as in the step shown in FIG. 1 and described in the first embodiment, thereby to form a bump electrode 3 on the underlying film 14. The molten solder is preferably SnPb eutectic solder or a SnAgCu-series solder, for example. Besides this, the projection may be formed with a high-melting-point material, and the bump electrode may be formed of a SnPb eutectic solder.

According to this method, the projection 7 pierces and breaks a thin oxide coat present on the surface of the molten solder when the molten solder impinges upon the projection 7. This allows the surface of the underlying film 14 to be wetted with the solder, and the solder spreads easily over the entire surface to sufficiently form an alloy layer of the solder and the underlying electrode 14. As a result, a good joining strength between the bump electrode 3 and the underlying film 14 can be obtained.

Figure 5:
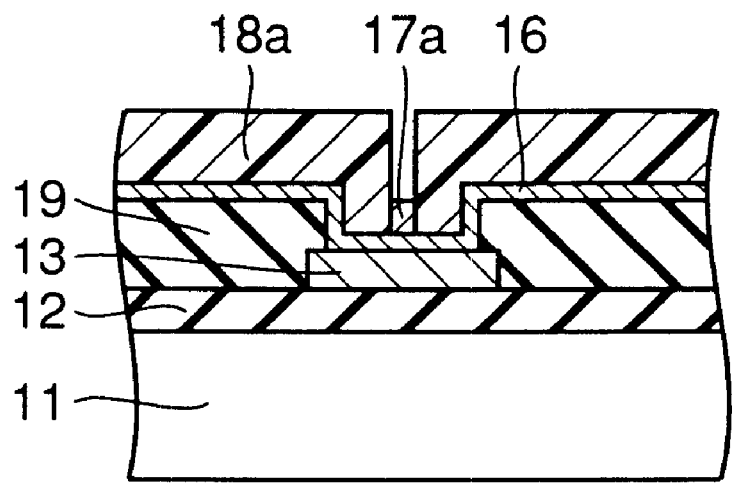
FIG. 5 is a cross-sectional view illustrating one step in the electrode forming method according to the first modification in the third embodiment.

Next, a first modification according to this embodiment will be described. Referring to FIG. 5, an underlying film 16 containing copper, for example, is formed as an underlying film. Next, a predetermined resist pattern 18a is formed to expose the surface of the underlying film 16. Next, a convex plating part 17a is formed on the underlying film 16 by performing a nickel plating treatment.

Figure 6:
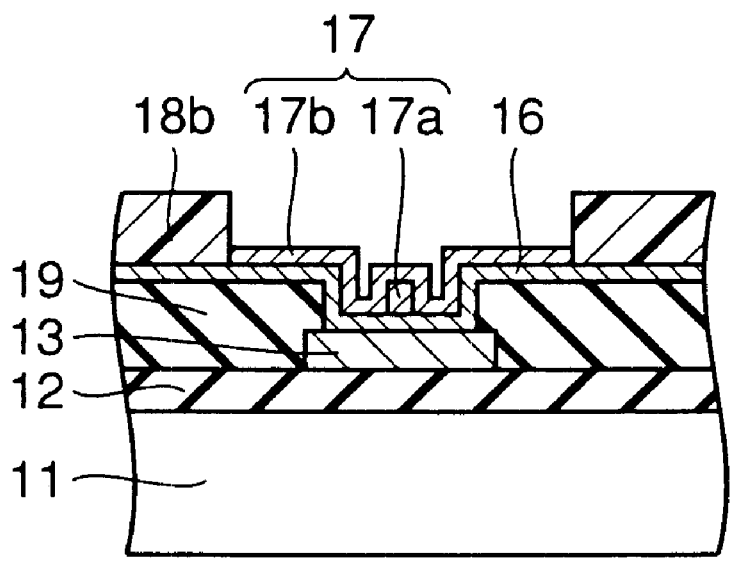
FIG. 6 is a cross-sectional view illustrating a step carried out after the step shown in FIG. 4 in the third embodiment.
Figure 7:
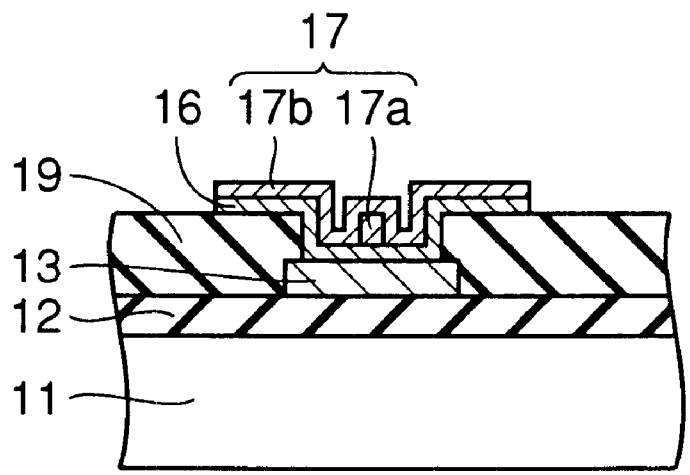
FIG. 7 is a cross-sectional view illustrating a step carried out after the step shown in FIG. 6 in the third embodiment.

Next, referring to FIG. 6, a resist pattern 18b is formed. The exposed surface of the underlying film 16 is further subjected to nickel plating to form an underlying film 17. At this time, since the plating part 17a is formed on the surface of the underlying film 16, the nickel plating grows with this plating part 17a serving as a nucleus, whereby a projection 17a is formed in the underlying film 17. Thereafter, the resist pattern 18b is removed, as shown in FIG. 7.

Figure 8:
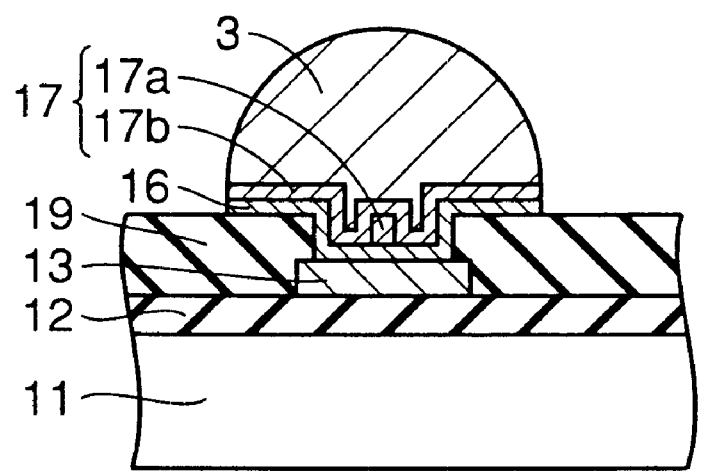
FIG. 8 is a cross-sectional view illustrating a step carried out after the step shown in FIG. 7 in the third embodiment.

Next, referring to FIG. 8, the molten solder is ejected from the ejecting head towards the projection 17a in the same manner as in the step shown in FIG. 1 and described in the first embodiment, thereby to form a bump electrode 3 on the underlying film 17.

By this method also, as described before, the projection 17a pierces and breaks a thin oxide coat present on the surface of the molten solder when the molten solder impinges upon the projection 17a. This allows the surface of the underlying film 17 to be wetted with the solder, and the solder spreads easily over the entire surface to sufficiently form an alloy layer of the solder and the underlying electrode 17. As a result, a good joining strength between the bump electrode 3 and the underlying film 17 can be obtained.

Figure 9:
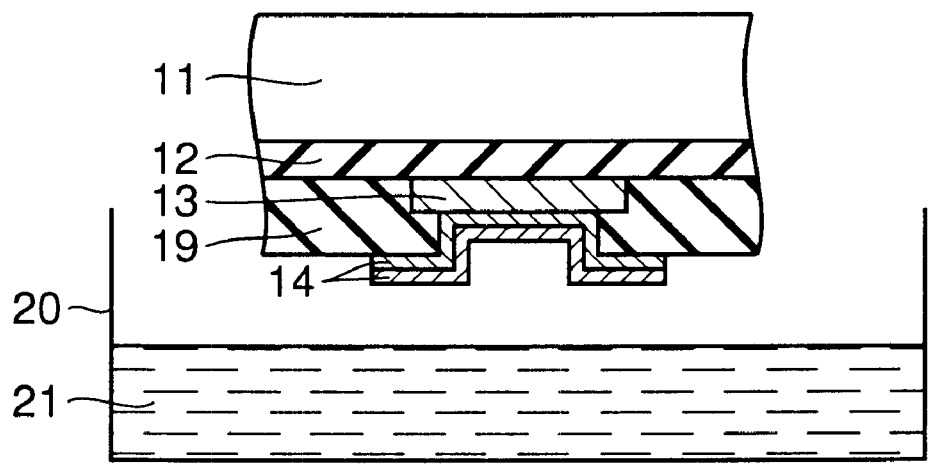
FIG. 9 is a cross-sectional view illustrating one step in the electrode forming method according to the second modification in the third embodiment.
Figure 10:
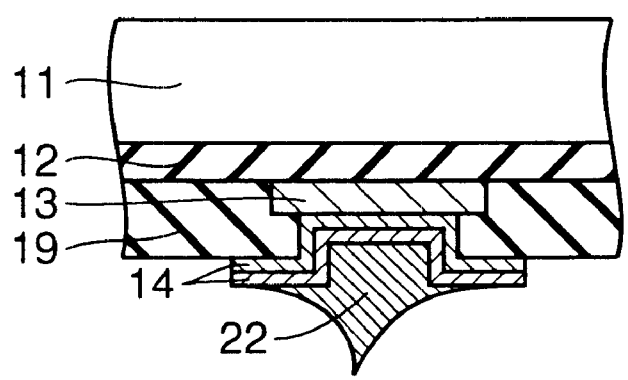
FIG. 10 is a cross-sectional view illustrating a step carried out after the step shown in FIG. 9 in the third embodiment.

Next, a second modification according to this embodiment will be described. First, referring to FIG. 9, a molten solder 21 is prepared in a solder tank 20. By placing a silicon substrate 11 having an underlying film 14 formed thereon so that the surface of the silicon substrate 11 faces downwards, the underlying film 14 is brought into contact with the surface of the molten solder 21, and thereafter, the underlying film 14 is separated from the surface of the molten solder 21. This allows a solder projection 22 to be formed on the surface of the underlying film 14, as shown in FIG. 10.

Figure 11:
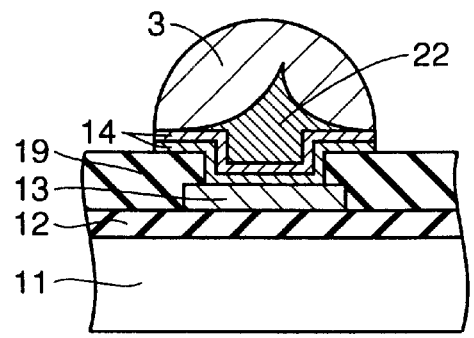
FIG. 11 is a cross-sectional view illustrating a step carried out after the step shown in FIG. 10 in the third embodiment.

Next, referring to FIG. 11, the molten solder is ejected from the ejecting head towards the projection 22 in the same manner as in the step shown in FIG. 1 and described in the first embodiment, thereby to form a bump electrode 3 on the underlying film 14.

By this method also, as described before, by impingement of the molten solder upon the projection 22, the surface of the underlying film 14 is wetted with the solder, and the solder spreads easily over the entire surface to sufficiently form an alloy layer of the solder and the underlying electrode 14. As a result, a good joining strength between the bump electrode 3 and the underlying film 14 can be obtained.

Here, by performing a predetermined plasma cleaning treatment after the projection is formed, the wettability of the underlying film including the projection is improved, whereby the joining strength between the bump electrode and the underlying film can be further improved.

Fourth Embodiment

An electrode forming method according to the fourth embodiment of the present invention will be described. In this electrode forming method, supersonic wave is applied to the semiconductor device in the step of forming a bump electrode described in the first embodiment.

Figure 12:
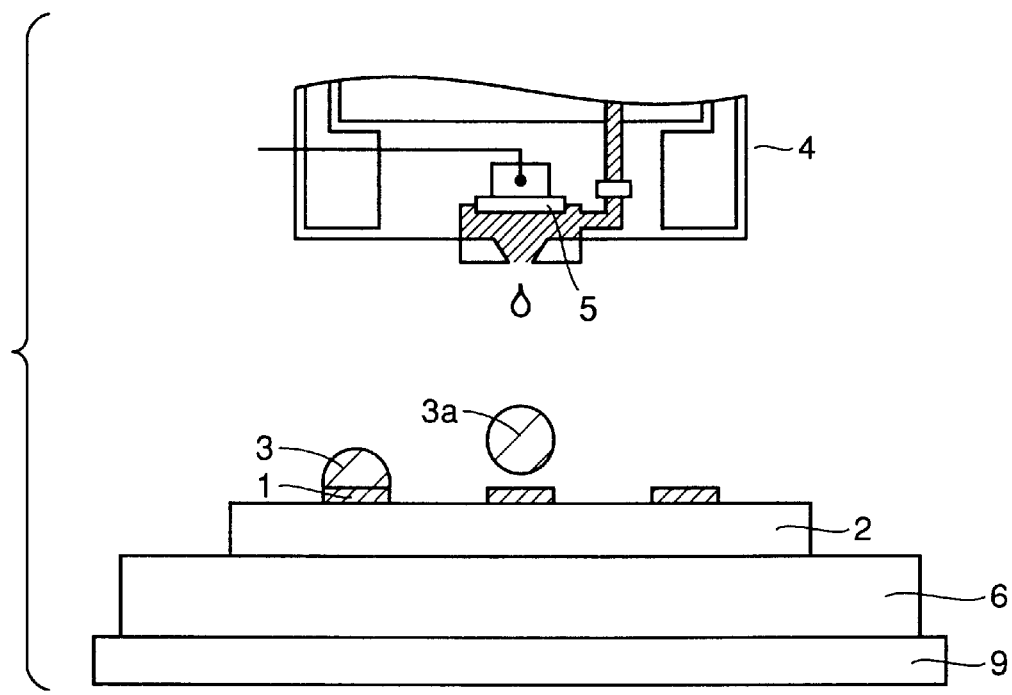
FIG. 12 is a cross-sectional view illustrating one step in the electrode forming method according to a fourth embodiment of the present invention.

Namely, referring to FIG. 12, a semiconductor device 2 having an electrode part 1 formed thereon is mounted on a supersonic wave vibrator 9. Here, at this time, a heating stage 6 may be allowed to intervene between the semiconductor device 2 and the supersonic wave vibrator 9.

Next, with the use of an ejecting head 4, the molten solder 3a is ejected from a nozzle towards the electrode part 1 to successively form bump electrodes 3, as described in the first embodiment.

According to this production method, a thin oxide coat present on the surface of the molten solder 3a ejected from the ejecting head 4 is easily broken by the supersonic vibration of the electrode part 1 when the molten solder 3a impinges upon the surface of the electrode part 1. This allows the surface of the electrode part 1 to be wetted with the solder, and the solder spreads easily over the entire surface to further sufficiently form an alloy layer of the solder and the electrode part 1, whereby a good joining strength between the bump electrode 3 and the electrode part 1 can be obtained.

Figure 13:
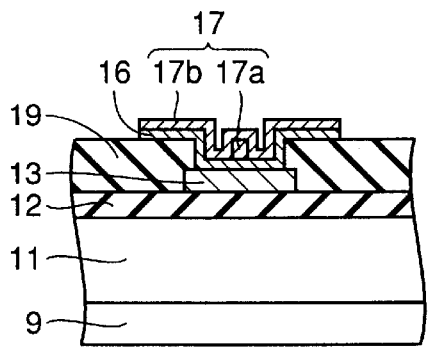
FIG. 13 is a cross-sectional view illustrating one step in the electrode forming method according to a modification in the fourth embodiment.

Furthermore, the method of applying supersonic wave can be likewise applied to the method described in the third embodiment. Referring to FIG. 13, a semiconductor device 2 having a projection 7 formed thereon is mounted on a supersonic wave vibrator 9, and a molten solder is ejected towards the projection.

The projection 7 easily pierces and breaks a thin oxide coat present on the surface of the molten solder by supersonic vibration when the molten solder impinges upon the projection 7. This allows the surface of the underlying film 14 to be wetted with the solder, and the solder spreads easily over the entire surface to further sufficiently form an alloy layer of the solder and the underlying electrode 14. As a result, a good joining strength between the bump electrode 3 and the underlying film 14 can be obtained.

Fifth Embodiment

In the first to fourth embodiments, a method for forming a bump electrode on a semiconductor device and the semiconductor device used therefor have been described. This method of forming a bump electrode is not limited to semiconductor devices, and can also be applied to the case of forming a bump electrode on a substrate on which a semiconductor device is to be mounted. In the fifth embodiment, this will be described. The method of this case is substantially the same as the methods described in the first to fourth embodiments except that the semiconductor device is replaced with a substrate.

Figure 14:
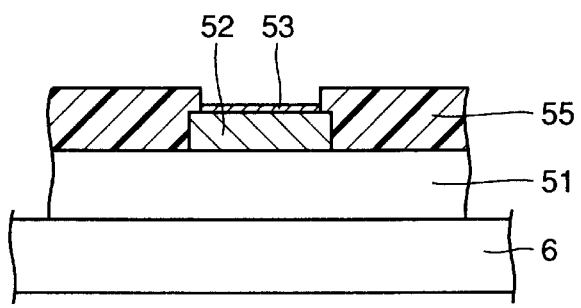
FIG. 14 is a cross-sectional view illustrating one step in the first example of the electrode forming method according to a fifth embodiment of the present invention.
Figure 15:
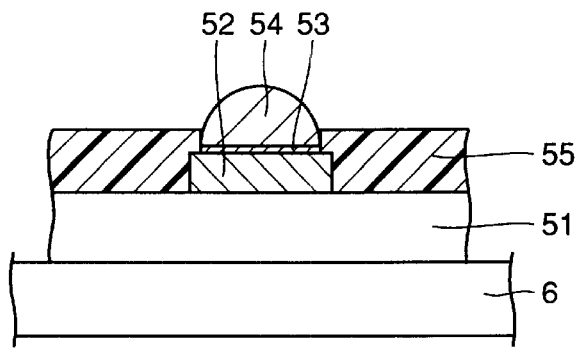
FIG. 15 is a cross-sectional view illustrating a step carried out after the step shown in FIG. 14 in the fifth embodiment.

First, referring to FIG. 14, a pad electrode 52 is formed on a predetermined region of a substrate 51 as an underlayer for forming a bump electrode. On the pad electrode 52 is formed a layer of an underlying film 53 including a gold plating layer on the uppermost surface thereof for prevention of corrosion. A solder resist 55 is formed on a region of the substrate 51 other than the pad electrode 52. This substrate 51 is mounted on a heating stage 6 which has been set within a predetermined temperature range. Next, referring to FIG. 15, with the use of an ejecting head (not illustrated), a molten solder is ejected from a nozzle towards the pad electrode 52 to form a bump electrode 54. Here, by forming the bump electrode 54, the gold plating layer located on the uppermost surface of the underlying film 53 diffuses into the solder.

In this case also, the joining strength between the bump electrode 54 and the pad electrode 52 is improved by setting the temperature of the heating stage 6 so that the temperature range of the substrate 51 will be a predetermined temperature range in accordance with the cleanness of the pad electrode 52 and the melting point of the solder, as described in the first embodiment.

Figure 16:
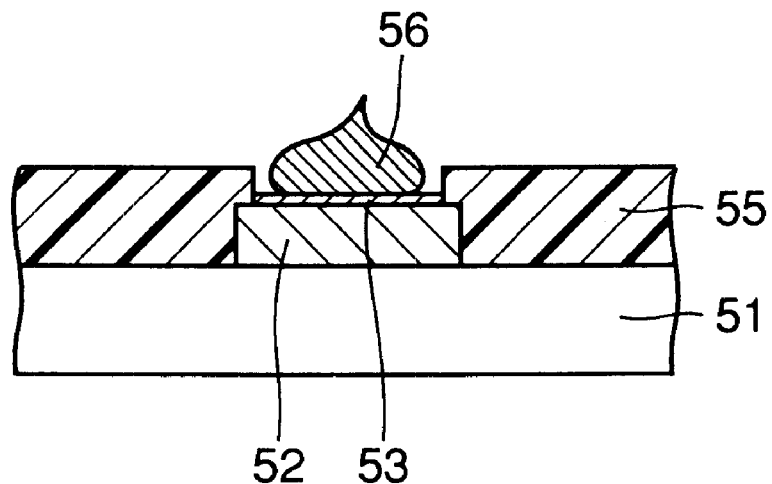
FIG. 16 is a cross-sectional view illustrating one step in the second example of the electrode forming method according to the fifth embodiment of the present invention.
Figure 17:
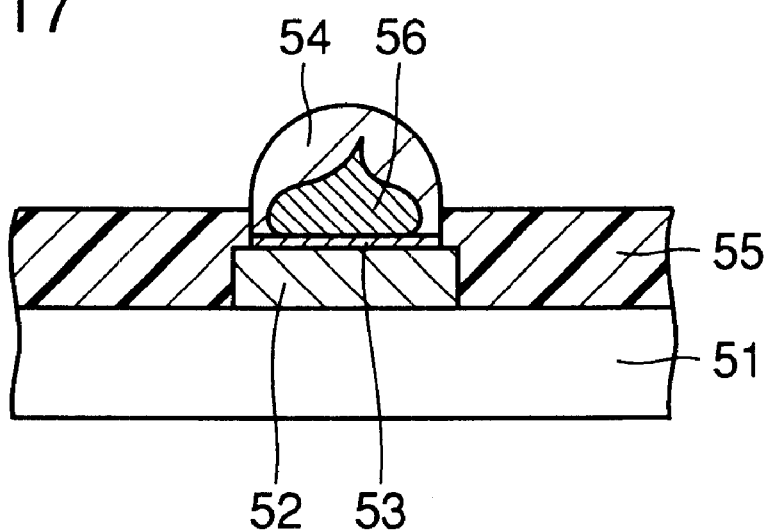
FIG. 17 is a cross-sectional view illustrating a step carried out after the step shown in FIG. 16 in the fifth embodiment.

Further, a projection may be disposed on the pad electrode formed on the substrate. Namely, a projection 56 made of solder or the like may be formed on the pad electrode 52, as shown in FIG. 16, and the molten solder may be ejected towards the projection 56 to form a bump electrode 54, as shown in FIG. 17.

Figure 18:
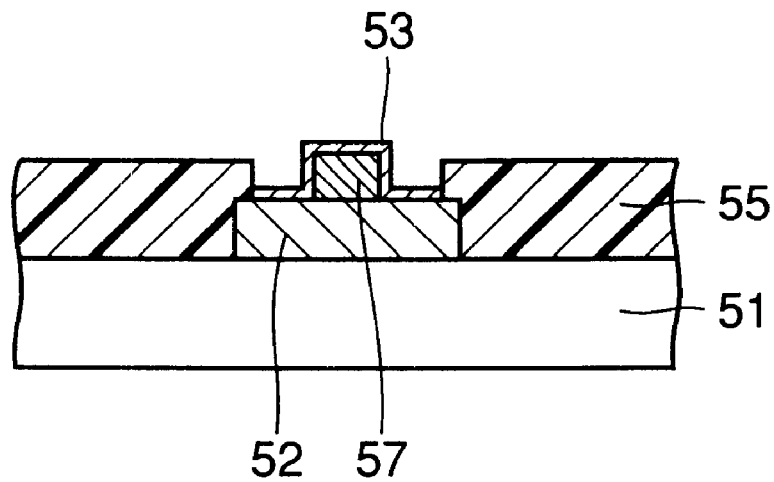
FIG. 18 is a cross-sectional view illustrating one step in the third example of the electrode forming method according to the fifth embodiment of the present invention.
Figure 19:
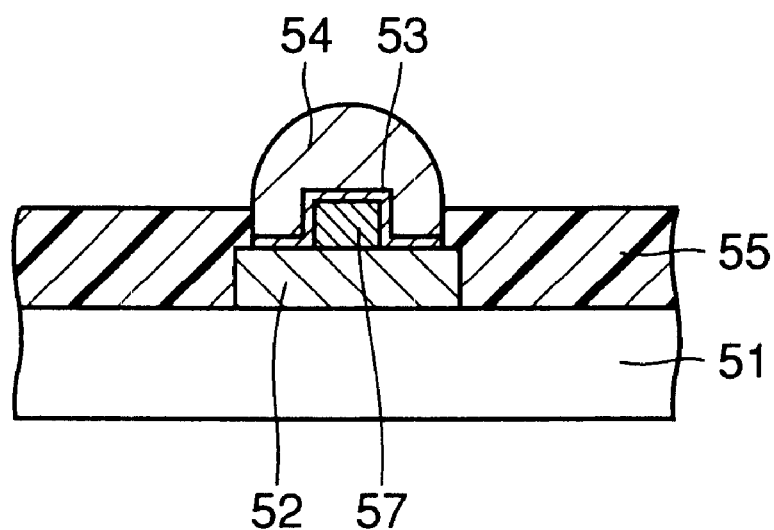
FIG. 19 is a cross-sectional view illustrating a step carried out after the step shown in FIG. 18 in the fifth embodiment.

Alternatively, a projection 57 made of copper may be formed on the pad electrode 52, as shown in FIG. 18, and the molten solder may be ejected towards the projection 57 to form a bump electrode 54, as shown in FIG. 19.

In every case, the projection 56, 57 pierces and breaks a thin oxide coat present on the surface of the molten solder when the molten solder impinges upon the projection 56, 57. This allows the surface of the pad electrode 52 (the underlying film 53) to be wetted with the solder, and the solder spreads over the entire surface, whereby a good joining strength between the solder and the pad electrode 52 can be obtained. Here, the bump electrode 54 may be formed by mounting the substrate 51 on a supersonic wave vibrator, in the same manner as described in the fourth embodiment.

While the invention has been shown and described in detail, the foregoing description is in all aspects illustrative and not restrictive. It is therefore understood that numerous other modifications and variations can be devised without departing from the scope of the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode forming method comprising:
   heating an underlying conductive region to at least 60° C. for forming a bump electrode on an underlying conductive region;
   ejecting molten solder having a melting point onto the underlying conductive region, after heating the underlying conductive region to at least 60° C. and less than the melting point of the solder; and
   solidifying the solder on the underlying conductive region to complete a bump electrode.

2. The electrode forming method according to claim 1, including plasma-cleaning said underlying conductive region by exposing a surface of said underlying conductive region to a plasma before ejecting the molten solder.

3. The electrode forming method according to claim 1, including heating the underlying conductive region to at least 150° C.

4. The electrode forming method according to claim 3, including cooling and solidifying the solder on the underlying conductive region after adhesion of the molten solder on the underlying conductive region.

5. The electrode forming method according to claim 1, including applying ultrasonic vibration to the underlying conductive region when the molten solder impinges on the underlying conductive region for improving adherence of the molten solder to the underlying conductive region.

6. An electrode forming method including:
   forming a projection, having a melting point higher than a solder, on and projecting from a surface of an underlying conductive region;
   ejecting solder, while molten, onto the projection so the projection pierces a surface of the molten solder as the molten solder impinges on the underlying conductive region; and
   solidifying the solder so the solder adheres to the underlying conductive region.

7. The electrode forming method according to claim 6, including plasma-cleaning the underlying conductive region by exposing the underlying conductive region to a plasma after forming the projection and before ejecting the molten solder.

8. The electrode forming method according to claim 6, including applying ultrasonic vibration to the underlying conductive region when the molten solder impinges on the underlying conductive region for improving adherence of the molten solder to the underlying conductive region.

9. The electrode forming method according to claim 6 including forming the projection by plating a metal.

10. The electrode forming method according to claim 6 including forming the projection by depositing a solder alloy having a melting point higher than the solder ejected onto the projection.

11. A bump electrode formable base on which a bump electrode is to be formed on an underlying conductive region by ejecting molten solder towards said underlying conductive region, comprising:
    a substrate;
    an underlying conductive region supported by the substrate;
    a projection supported by and projecting from the underlying conductive region, made of a first solder, for piercing an oxide coating on a surface of a second solder, while molten, when the molten second solder impinges on the underlying conductive region.

12. The bump electrode formable base according to claim 11, wherein the underlying conductive region is located on a semiconductor chip.

13. The bump electrode formable base according to claim 11, wherein the underlying conductive region is located on a substrate.

* * * * *